United States Patent [19]

Hiraki et al.

[11] Patent Number: 4,597,844

[45] Date of Patent: Jul. 1, 1986

[54] COATING FILM AND METHOD AND APPARATUS FOR PRODUCING THE SAME

[75] Inventors: Akio Hiraki, Nishinomiya; Tatsuro Miyasato, Osaka; Masao Hayashi, Wako, all of Japan

[73] Assignee: Kabushiki Kaisha Meidensha, Tokyo, Japan

[21] Appl. No.: 711,018

[22] Filed: Mar. 12, 1985

[30] Foreign Application Priority Data

Mar. 6, 1984 [JP] Japan ................. 59-46397
Aug. 6, 1984 [JP] Japan ................. 59-163795
Aug. 6, 1984 [JP] Japan ................. 59-163796

[51] Int. Cl.$^4$ ............................... C23C 15/00
[52] U.S. Cl. ........................... 204/192 C; 204/192 R; 204/192 SP; 204/192 E; 204/298; 428/408
[58] Field of Search ......... 204/192 C, 192 E, 192 SP, 204/192 R, 298; 428/408

[56] References Cited

U.S. PATENT DOCUMENTS

| | | | |
|---|---|---|---|
| 3,840,451 | 10/1974 | Golyanov et al. | 204/192 C |
| 4,412,903 | 11/1983 | Green et al. | 428/408 |
| 4,431,562 | 2/1984 | Hiraki et al. | 252/188.25 |
| 4,486,286 | 12/1984 | Lewin et al. | 428/408 |
| 4,487,799 | 12/1984 | Galasso et al. | 424/408 |
| 4,490,229 | 12/1984 | Mirtich et al. | 204/192 C |
| 4,504,519 | 3/1985 | Zelez | 428/408 |
| 4,524,106 | 6/1985 | Flasck | 204/192 C |
| 4,551,216 | 11/1985 | Argyo | 204/192 C |

OTHER PUBLICATIONS

Rizk et al., Vacuum 27(1977), pp. 601-604.
Zelez, J. Vac. Sci. Technol. A, vol. 1, 1983, pp. 305-307.
Holland et al., Thin Solid Films 48(1978), pp. L21-L23.

*Primary Examiner*—Arthur P. Demers
*Attorney, Agent, or Firm*—Fleit, Jacobson, Cohn & Price

[57] ABSTRACT

A coating film comprises an amorphous carbon of a specified atomic ratio with respect to hydrogen and carbon and it is excellent in hardness, oxidation resistance, thermal resistance, electric resistance and thermal conductivity. The coating film is produced by sputtering a graphite target electrode in an atmosphere of hydrogen, fluorine or a mixture of hydrogen and fluorides having a gas pressure of 6.665 to 666.5 Pa (0.05 to 5.0 Torr) while maintaining the relative current density for the graphite target electrode and a power source between 11.3 and 14.7 ma/cm$^2$ thereby limiting the H/C ratio in terms of an atomic ratio between 0.5 and 0.9. A sputtering apparatus used for producing such coating film includes a coating forming deposition substrate arranged at a position within a sputtering vacuum container which is not directly exposed to a plasma or a deposition substrate mounted on an electron drawing electrode within the container and a plasma adjusting electrode positioned in front of the substrate.

13 Claims, 6 Drawing Figures

COATING FILM AND METHOD AND APPARATUS FOR PRODUCING THE SAME

BACKGROUND OF THE INVENTION

1. Field of the Invention

The present invention relates to a coating film of material which comprises amorphous carbon, has high hardness, high oxidation resistance, high thermal resistance, high electric resistance and high thermal conductivity, and a method and apparatus for producing the same.

2. Description of the Prior Art

It is well known that plastic material and common metal are susceptible to surface scratch so that the surfaces initially having excellent luster gradually lose the luster and damage an appearance.

This has been considered to be due to the fact that these plastic material and metal are relatively soft and have low abrasion resistance.

Means heretofore used for overcoming these disadvantages include the application of hard and thin-film coating to the surface of material having soft surface such as cutting tool, bite etc. to provide durable and lustrous surface and industrially the application of extreme hard film to the surface to make them durable for a long period of time, and recently studies have been made on the application of coatings of silicon carbide and boron nitride to the surfaces of bite to provide more excellent surface materials. However, these methods still leave some disadvantages to be desired.

Also, in the case of material which when contacted with heat or oxygen will be decomposed or react to change the properties as well as protective coating film such as antioxidation coating film applied to the surface of electronic equipment devices (e.g., GaAs semiconductor, ZnS EL device and HgCdTe infrared sensor element) which are required to operate stably for a long period of time, it is essential to have recourse to material and method which permit the application of surface coating at relatively low temperature.

Also, considering the case of solar cell comprising amorphous silicon, etc., containing large amount of hydrogen or large amount of hydrogen and fluorine, the cell essentially has low energy converting efficiency and is compensated for by means of the increased area or the like. However, there still exists a need for the development of materials of higher efficiencies for the surface coating films in view of the necessity to ensure a sufficient amount of incident light to the solar cell.

On the other hand, from the standpoint of ensuring a sufficient durability for the component parts subjected to severe wear, e.g., the bearing of rotary member, and gear, the abrasion resistant coatings which have presently been used are insufficient and there is a need for coatings of longer durability.

Considering again the case of semiconductor, the conventional silicon semiconductors are subject to limitations that the forbidden band gap is as narrow as 1.21 eV and they cannot be used at high temperature thus giving rise to a need for the development of material having wider range of working temperatures.

The conventional sputtering methods include one in which an argon plasma is produced by applying a voltage across an anode and a cathode in any argon gas or the like of about 0.133 to 1.33 Pa ($10^{-3}$ to $10^{-2}$ Torr) and a target material is sputtered by the argon ion thereby forming an alloy coating on a substrate.

An example of the sputtering apparatus used with the above-mentioned conventional technique is disclosed for example in U.S. Pat. No. 4,431,562.

With the technique of forming a high-hard amorphous carbon film of high electric insulating quality by the sputtering process, increasing the input power is effective for the purpose of preventing the occurrence of defects in the coating film, increasing the rate of film formation and so on.

SUMMARY OF THE INVENTION

It is the primary object of the present invention to provide a coating film of material which is suited for use in the above-mentioned application, has high hardness, high oxidation resistance, high thermal resistance, high abrasion resistance, excellent thermal conductivity and high electric resistance, its production method and an apparatus capable of eliminating the occurrence of defects in coating and thereby producing homogeneous coating film.

Specifically, in accordance with one form of the invention there is provided an amorphous carbon or coating film of material featuring that the value of H/C or (H+F)/C in terms of an atomic ratio is selected to have a ratio of 0.5 to 0.9 by sputtering a graphite target placed in an atmosphere having a gas pressure of 6.665 to 666.5 Pa(0.05 to 5 Torr) using a depositing substrate temperature ranging from the room temperature to 100° C. (and a relative current density (plate current/area of target electrode), is ranging from 11.3 to 14.7 mA/cm$^2$).

In accordance with another form of the invention there is provided a method of producing a coating film of material featuring that it comprises an amorphous carbon film having the value of H/C or (H+F)/C in terms of an atomic ratio selected to have a ratio of 0.5 to 0.9 by sputtering a graphite target using a deposition substrate temperature ranging from the room tempraturte to 100° C., a vacuum chamber gas pressure ranging from 6.665 to 666.5 Pa(0.05 to 5 Torr) and a relative current density ranging from 11.3 to 14.7 mA/cm$^2$.

In accordance with still another form of the invention there is provided a sputtering apparatus of the type in which a pair of opposed electrodes are arranged within a vacuum container having a low pressure atmosphere gas inlet pipe and an exhaust pipe and a plasma is provided with a directional property by a magnetic field and the apparatus features that a deposition substrate is arranged in such a manner that it is held within the container so as not to be directly exposed to the plasma.

The present invention has been completed as a result of various studies and investigations made in view of the foregoing disadvantages of the conventional methods so as to provide an amorphous carbon coating film of material which has high hardness, high oxidation resistance, high abrasion resistance, high thermal resistance, high thermal conductivity and high electric resistance properties, its production method and an apparatus capable of preventing for example various difficulties assumed to be due to the fact that a substrate is placed in a plasma and producing a coating film of material having excellent uniformity and on the basis of the resulting discovery that an amorphous carbon coating film can be formed in an extremely excellent state by effecting the sputtering operation by adding specific requirements for using the conventional sputtering method.

From the results of the various studies and investigations it has been discovered that the value of the H/C ratio can be reduced by effecting the sputtering operation with an increased gas pressure, that decreasing the H/C ratio of the coating material to 0.5 or less has the effect of reducing the hardness of the coating film and making it impractical and that increasing the H/C ratio to exceed 0.9 is not desirable since the optical band gap or the electric resistance is decreased and hence the insulating capability is deteriorated. In view of this fact, it is desirable to maintain the H/C ratio of the coating film of material in a range between 0.5 and 0.9.

Also, it has been confirmed that it is desirable to maintain the gas pressure in a range between 6.665 Pa and 666.5 Pa (0.5 to 5 Torr) during the sputtering.

It has been found that decreasing the plate current from the power source during the sputtering operation generally tends to increase the hardness of a coating film and it has been found that with a high frequency power source, for example, hardnesses of 2,000 to 1,500 are obtainable with relative current densities of 11.3 mA/cm$^2$ and over.

Considering this fact, the range of working relative current densities should preferably be selected to be 11.3 to 14.7 mA/cm$^2$.

A coating film of material produced in accordance with the present invention has a very high hardness, high thermal resistance and high electric resistance, is high in infrared ray transparency and is excellent in chemical resistance, moisture resistance and scratch resistance as will be seen from examples which will be described later. More specifically, the coating enjoys the following effects.

(1) The coating film produced in accordance with the present invention has the maximum Vickers hardness of 4,000 which is second to that of diamond and therefore the application of this coating to a metal or plastic not only ensures a long durable lustrous surface which is not susceptible to any scratch but also makes possible the application of the coating to cutting bite, etc., which are used under severe conditions.

(2) Since the coating film can be produced at the room temperature despite the fact that its electric resistance is on the $10^{14}$ Ω cm level which is close to those of insulators, that it is extremely uniform (compact) and that it is excellent in such environmental resistance properties as chemical resistance, moisture resistance and thermal resistance as will be seen from the examples, the coating film is best suited for example as the coating for GaAs semiconductor, HgCdTe element and material susceptible to the effect of heat and oxygen.

(3) Since the coating film is transparent in the infrared region, has an excellent infrared transmission factor and has a refractive index of about 1.8 to 2.0 which is substantially equal in value to the square root of the refractive index (n=3.5) of silicon, the coating is best suited for use as a reflection preventive coating film for solar cell.

(4) Since the coating film can be uniformly applied to materials of all shapes, it is possible to expect the provision of abrasion resistance by the application of the coating to bearings, sliding portion of common machine elements, etc.

(5) For example, where the coating film is used to produce an amorphous carbon, F type solar cell, there is no danger of any deterioration in the electric resistance, hardness and optical transparency even it is used in higher temperature environments due to its improved high thermal resistance.

(6) By adjusting the type of a gas of atmosphere during the sputtering period, it is possible to alternately deposit conducting film and insulating film thereby forming a laminated thin-film capacitor.

(7) Where such adjusting technique is utilized to form conducting and insulating films, it is possible to easily produce a hybrid thin-film circuit by using suitable masks and forming any given number of layers and in such a case the insulating film portion can be converted to conducting film through the radiation of a laser beam or electron beam thereby ensuring a wide range of application operations.

(8) By adjusting and changing a doped target or atmosphere gas, it is possible to produce such semiconductor devices which are not only wide in energy gap between valence band and conduction band but also high in surface hardness.

(9) Due to the arrangement of a deposition substrate in a position which is not exposed to a plasma, the film forming rate of an amorphous carbon film is increased thus making possible the formation of a film which is homogeneous and reduced in dangling bonding.

(10) By arranging substrates on the wall portions of the vacuum chamber, it is possible to increase the usable area than previously and therefore it is possible to do much toward decreasing the cost.

(11) By providing a mesh electrode between the target electrode and the substrate electrode and maintaining the mesh electrode at the ground potential, it is possible to protect the substrate from the plasma and produce a coating film having a reduced spin density, increased electric resistance and excellent optical transparency.

(12) Where the mesh electrode is used, it is possible to adjust the rate of film formation by suitably adjusting the distance between the target electrode and the substrate electrode and the distance between the target electrode and the grounded electrode.

DESCRIPTION OF THE PREFERRED EMBODIMENT

The function of a sputtering apparatus for producing such thin-film coating of material which is smooth and has no surface defects will be described with reference to the schematic diagram shown in FIG. 1.

In the Figure, numeral 1 designates a vacuum chamber, 4 an atmosphere gas inlet pipe, and 5 an exhaust pipe connected directly to a vacuum pump which is not shown to maintain a vacuum. Numeral 7 designates an electron drawing counter electrode at the ground potential, and 2 a carbonaceous electrode connected to a high frequency (RF) power source 6 through a matching box 8.

Numeral 3 designates deposition substrates arranged inside the container but outside the transport area of a plasma-excited source in contrast to the conventional techniques. It is to be noted that a hydrogen gas or any other gas is introduced the atmosphere gas inlet pipe 4.

Figure 1:
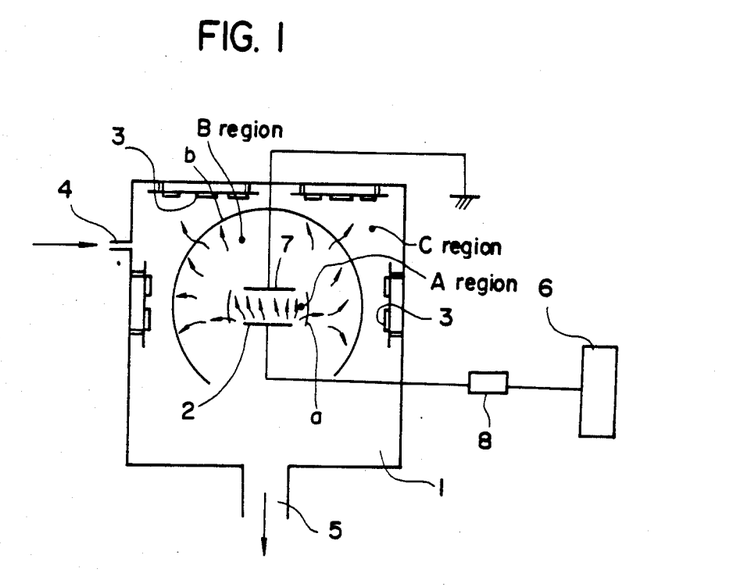
FIG. 1 is a schematic diagram of a planar magnetron type sputtering apparatus in accordance with the present invention.

In accordance with the present invention, the interior of the vacuum chamber is considered by dividing it into three regions, e.g. A region, B region and C region as schematically shown in the FIG. 1. The A region, represents the area enclosed by curved lines a which is plasma state environment produced between the electrodes and the vicinity around the electrodes and carbon and hydrocarbon radical consisting two carbon atoms or less such as C, CH, $CH_2$, $CH_3$, $CH_4$, $C_2H_4$ and $C_2H_6$ are generated from the target electrode 2 in this region.

The B region represents the area enclosed by a curved line b on the side of the electrodes 2 and 7 and in this region the above-mentioned particles contained in the plasma are transported at a velocity which is determined by the pressure of the atmosphere gas and the voltage across the electrodes.

The C region represents the area other than the A region and the B region and in this region the transported particles are softly deposited on the deposition substrates arranged on the container inner walls.

It is to be noted that in the actual operation, the charged particle constituting the majority of the transported particle is susceptible to the effect of an electric field or the like therefore it is necessary for example to give consideration so that the C region is maintained at a uniform potential, e.g., around the ground potential.

In the sputtering apparatus so constructed, during the operation of the sputtering the substrates are always not directly exposed to the plasma produced between the target electrode and the counter electrode so that the deposition and the bombardment by proton and electron do not occur simultaneously at the substrate and therefore there is no danger of causing any defects (depressions) within or in the surface of coating films deposited on the substrates.

Also, in these circumstances the rate of film formation can also be increased.

The following examples describe the present invention in more detail.

EXAMPLE 1

Figure 2:
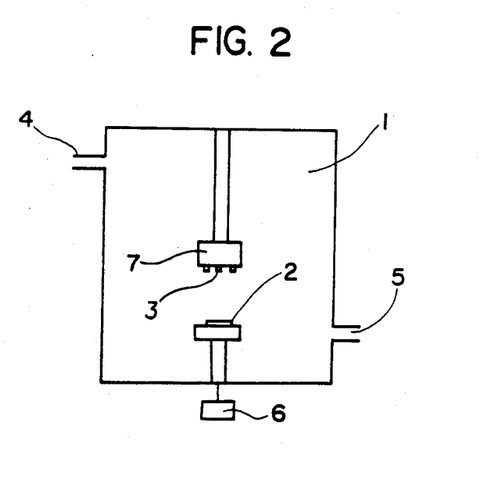
FIG. 2 is a schematic sectional view of a conventional sputtering apparatus.

A graphite target 2 of 75 mm$\phi$ was placed inside a vacuum chamber 1 of a planer magnetron type sputtering apparatus shown by the schematic sectional view of FIG. 2 and a substrate material 3 consisting of an organic film, Si, glass, $Al_2O_3$ or $TiO_2$ was mounted on a counter electrode 7 held at a distance of 45mm from the counter electrode 7. A vacuum was first produced within the vacuum chamber 1 by exhausting it to $1.333 \times 10^{-5}$ Pa ($1 \times 10^{-7}$ Torr) by an exhauster which was not shown through an exhaust pipe 5 and then a hydrogen gas of 99.999 vol. % was introduced through an atmosphere gas inlet pipe 4 thereby holding the internal pressure of the chamber at 6.665 Pa (0.05 Torr).

Then, a high frequency power of 13.56 MHz was supplied from a power source 6 having a supply anode voltage of 2.3 kV and the sputtering was effected for two hours with a plate current gf 0.5 A (a relative current density was 11.3 mA/cm$^2$). During the sputtering period, the substrate temperature was controlled by water cooling to prevent it from exceeding 100° C. When the sputtering was completed, a lemon yellowish transparent thin film having a thickness of about 1 $\mu$m was formed on the substrate and the results of the observation by a scanning microscope having a resolving power of 6 nm (60 Å) showed that the surface was quite smooth.

The film was subjected to an elementary analysis showing that it contained carbon, hydrogen and nitrogen and its H/C atomic ratio was 0.90. As a result of the permeable electron microscope observation, electron diffraction and X-ray diffraction it was found that the film had no definite structure and thus it was an amorphous film.

The results of IR absorption spectrum analysis showed that only the absorption due to C—H was observed and there was no spectrum due to C=C, C≡C, benzene ring, etc., in the film.

The optical band gap calculated from the visible ray absorption spectrum was 2.5 eV. Also, the film showed an electric resistivity of $1 \times 10^8$ $\Omega$ cm which was close to those of insulators and a spin density of $5 \times 10^{18}$ 1/cm$^3$ due to the electron spin resonance (ESR) and its hardness measured by a Vickers microhardness meter was 2,000.

Also, it was found that increasing the temperature during the sputtering tended to decrease the specific resistance of the film and it was also found that due target was not limited to graphite and the similar results could be obtained by using any high-purity carbonaceous substance.

EXAMPLE 2

Example 1 was repeated except that the pressure was held at 26.66 Pa (0.2 Torr) through the introduction of a hydrogen gas and that the anode current (relative current density=12.5 mA/cm$^2$) was 0.55 A. A lemon yellowish transparent film of 2 $\mu$m was formed on the substrate and it was confirmed that this film was as smooth as in the case of Example 1. It was also confirmed that the film was an amorphous film containing C, H and N and having an H/C ratio of 0.82 and that no C=C, C≡C and benzene ring were present. The electric resistivity was $1 \times 10^{10}$ $\Omega$ cm, the spin density due to the ESR was $1 \times 10^{18}$ 1/cm$^3$ and the hardness was 1,700.

EXAMPLE 3

Example 1 was repeated except that the pressure was held at 66.65 Pa (0.5 Torr) through the introduction of a hydrogen gas and that the plate current (relative current density=13.13 mA/cm$^2$) was 0.58 A. A lemon yellowish transparent film having a smooth surface and a thickness of 4 $\mu$m was formed on the substrate. It was the same as the foregoing examples in that the film was an amorphous film having an H/C atomic ratio of 0.75 and that no C=C, C≡C and benzene ring were present. Also, the optical gap was 2.9 eV and the film showed an electric resistivity of $7 \times 10^{10}$ $\Omega$ cm, a spin density of $7 \times 10^{18}$ 1/cm$^3$ and a hardness of 1,600.

EXAMPLE 4 to 7

Amorphous films having the corresponding physical properties to the variable factors shown in the following table were produced.

| Example | 4 | 5 | 6 | 7 |
|---|---|---|---|---|
| Hydrogen gas Pressure (Pa) | 133.3 | 266.6 | 66.65 | 66.65 |
| Supply voltage (kv) | 2.3 | 2.3 | 1.0 | 3.0 |
| Plate current (A) | 0.62 | 0.65 | 0.5 | 0.5 |
| Relative current density mA/cm$^2$ | 14.04 | 14.7 | 11.3 | 11.3 |
| Film thickness ($\mu$m) | 4.6 | 5.0 | 1.0 | 5.0 |
| H/C atomic ratio | 0.6 | 0.55 | 0.7 | 0.8 |
| Optical gap (eV) | 3.0 | 3.3 | 2.9 | 3.0 |
| Electric resistivity ($\times 10^{13}$ $\Omega$ cm) | 2.0 | 50.0 | 0.5 | 5.0 |
| Spin density ($\times 10^{16}$ 1/cm$^3$) | 20.0 | 5.0 | — | 2.0 |
| Hardness (Vickers) | 1,500 | 1,500 | — | — |

EXAMPLE 8

Example 1 was repeated except that a graphite target having attached thereonto a poly-4-ethylene fluoride sheet of an area corresponding to one half the target surface was used and that the hydrogen gas pressure was 66.65 Pa (0.5 Torr) and the supply voltage was 2.0 kV. The resulting film had a thickness of 2 $\mu$m and an (H+F)/C atomic ratio of 0.8 and only the absorption due to C—H and C—F was observed by the IR absorption spectrum.

The optical band gap was 2.8 eV, the electric resistivity was $7\times 10^{11}$ $\Omega$ cm and these properties were hot deteriorated even in the air at 400° C.

EXAMPLE 9

Example 1 was repeated except that the gas pressure in the vacuum chamber was held at 66.65 Pa (0.5 Torr) by means of a hydrogen gas of 99.999 vol. % and a fluorine gas of 99.999 vol. % and the supply voltage was 2.0 kV. The resulting film had a thickness of 4 $\mu$m and an (H+F)/C atomic ratio of 0.8 and only the absorption due to C—H and C—F was observed by the IR absorption spectrum. There were no spectra due to C=C, C≡C, benezene ring, etc. The film showed a band gap of 3.1 eV and an electric resistivity of $1\times 10^{14}$ $\Omega$ cm and its spin density due to the ESR was $1\times 10^{16}$ 1/cm$^3$. These properties were not changed even in the air at 400° C.

EXAMPLE 10

Example 1 was repeated except that a dc voltage of 400 V was applied in place of the high frequency power. A lemon yellowish transparent film having a smooth surface and a thickness of 1 $\mu$m was formed on the substrate and its H/C atomic ratio was 0.9. As a result of the observation by a permeable electron microscope, an electron diffraction and an X-ray analysis it was found that the film was an amorphous carbon film containing diamond structures of 3 nm or less in particle size in very small portions.

From the IR absorption spectrum of the film only the absorption due to C—H was observed and there was no spectrum due to C=C, C≡C, benzene ring or the like. The optical band gap calculated from the visible ray absorption spectrum was 3.0 eV and the electric resistivity and the hardness were respectively $1\times 10^{13}$ $\Omega$ cm and 4,000. It was also confirmed that the target was not limited to graphite and the similar results could be obtained by using any high-purity carbonaceous substance and that increasing the substrate temperature tended to decrease the specific resistance.

EXAMPLES 11 to 15

Amorphous films having the corresponding physical properties to the variable factors shown in the following table were produced.

| Example | 11 | 12 | 13 | 14 | 15 |
|---|---|---|---|---|---|
| Hydrogen gas pressure (Pa) | 118.0 | 66.65 | 133.3 | 266.6 | 66.65 |
| Supply voltage (V) | 400 | 400 | 400 | 400 | 400 |
| Plate current (A) | 0.5 | 0.5 | 0.5 | 0.5 | 0.5 |
| Relative current density (mA/cm$^2$) | 11.3 | 11.3 | 11.3 | 11.3 | 11.3 |
| Film thickness ($\mu$m) | 2 | 4 | 4.6 | 5 | 2 |
| H/C atomic ratio | 0.87 | 0.8 | 0.75 | 0.7 | 0.9 |
| Optical gap (eV) | 3.0 | 3.2 | 3.5 | 3.5 | 3.5 |
| Electric resistivity ($\times 10^{14}$ $\Omega$ cm) | 0.3 | 1 | 3 | 5 | 1 |
| Hardness (Vickers) | 3,500 | 3,500 | 3,000 | 3,000 | 4,000 |

It is to be noted that Example 15 was performed in a condition where a dc bias voltage of 100 V was applied to the substrate.

EXAMPLE 16

(Comparative Example)

In each of Examples 1 to 15, an argon gas was used in place of the hydrogen gas and the resulting amorphous films were graphitic films having electric resistivities of $1.8\times 10$ to $2.2\times 10^{-2}$ $\Omega$ cm.

Figure 3:
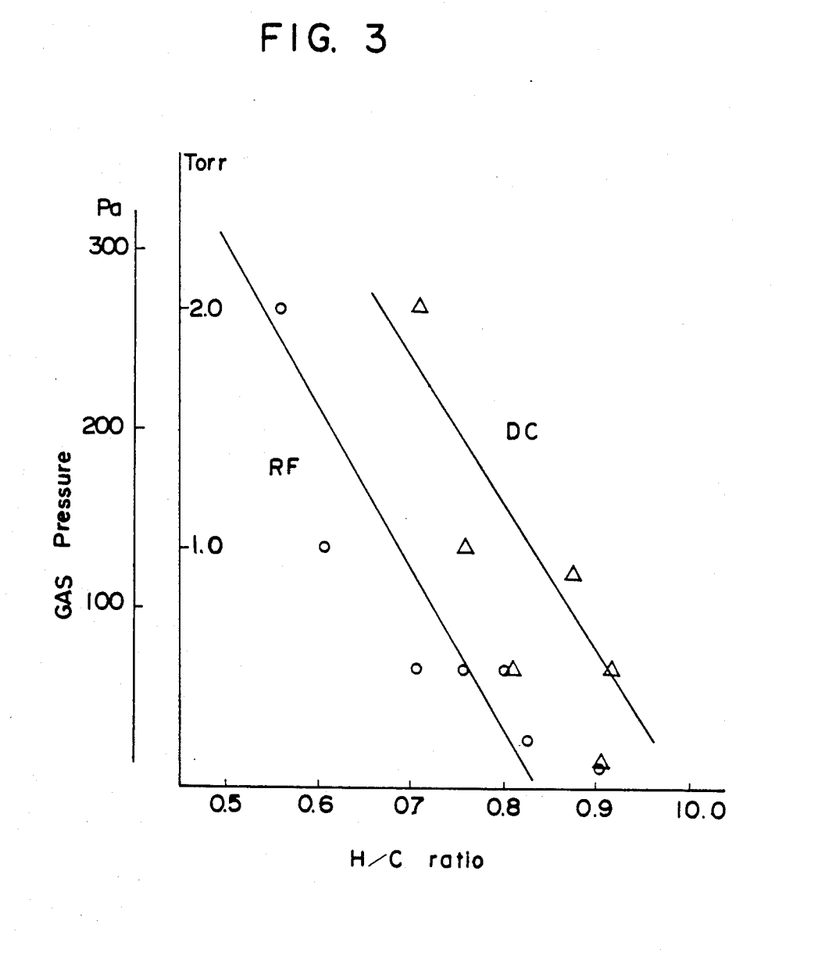
FIG. 3 is a graph showing the effect of atmosphere gas pressure on coating film of material.
Figure 4:
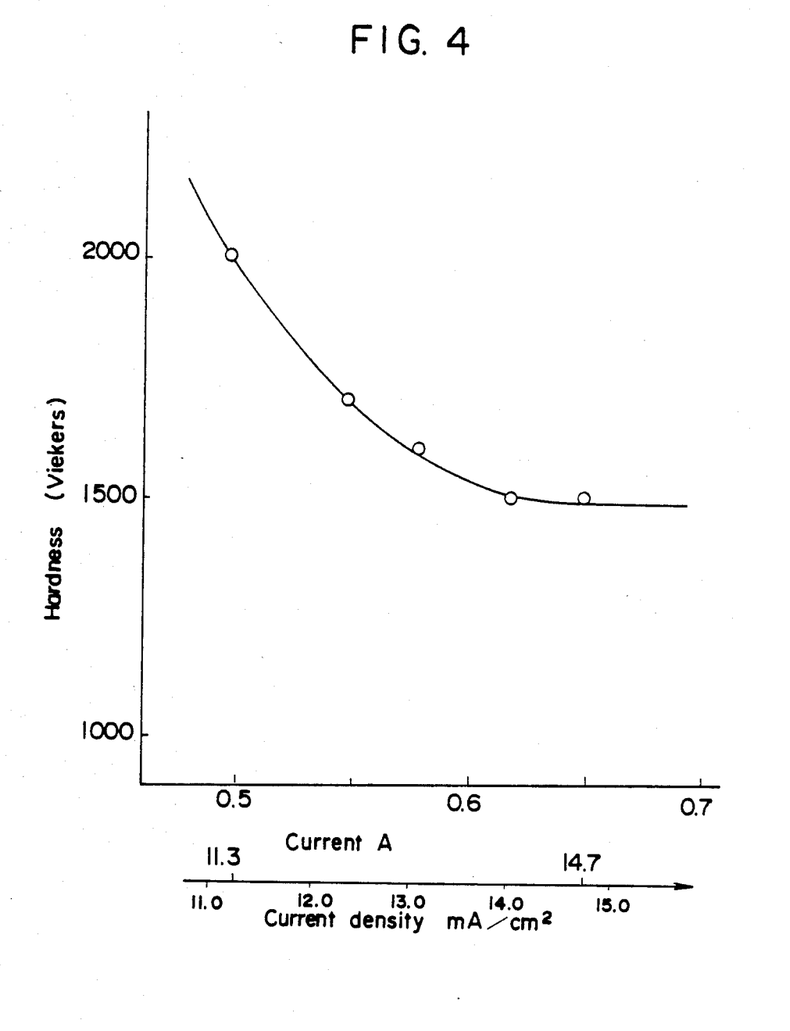
FIG. 4 is a graph showing the effect of applied current on the hardness of coating film.

FIG. 3 shows the relation between the H/C ratio and the gas pressure in the vacuum chamber for the amorphous films produced by Examples 1 to 16 and FIG. 4 shows the relation between the working current and the hardness for the amorphous films produced by Examples 1 to 5. From the behaviors shown in FIG. 3 it is apparent that increasing the atmosphere gas pressure during the sputtering operation decreases the H/C ratio of the resulting coating.

On the other hand, it will be seen from FIG. 4 that a coating of material having the desired hardness is produced when the anode current (relative current density) is within a specified range.

EXAMPLE 17

Each of the test films produced by Examples 1 to 15 was irradiated by a laser beam (electron beam=2 kW, laser=He—Ne laser, output=4 W) and only the irradiated portions showed electric resistivities of 1.8 to $2.2\times 10^{-1}$ $\Omega$ cm.

It is to be noted that the irradiation with electron rays in place of the laser beam showed the similar tendency.

EXAMPLE 18

In each of Examples 1 to 15, a graphite doped with boron was used as the target with the result that the presence of boron in the resulting films was detected and that such film properties as photoluminescent and photoconductive behaviors were recognized further.

This tendency or the similar behaviors were observed in cases where a graphite doped with phosphorus was used as the target or where the sputtering was effected by using a mixture of a hydrogen gas and a gas containing nitrogen, phosphorus and boron.

EXAMPLE 19

The following tests for chemical resistance, thermal resistance, moisture resistance, IR transmission and scratch resistance properties were performed on the amorphous films produced by Examples 1, 4, 8, 10, 13 and 15 with the result that these films showed the following effects and they proved to be extremely strong coatings.

Chemical Resistance Test

The films were respectively immersed in (1) a 20 wt. % hydrofluoric acid solution or (2) a concentrated nitric acid solution for one week and the observation of the films through a metallurgical microscope showed no change in the films as well as no change in their weight.

Thermal Resistance Test

The films were annealed in a vacuum or in an argon gas for 1 hour at 400° C. and no change was seen in their optical band gaps.

Moisture Resistance Test

After the immersion in the water at the room temperature for 24 hours, the film surfaces were observed through a microscope and no change was seen in the optical band gaps of the films.

IR Region Light Transmission

The light transmission of over 90% was confirmed at wavelengths of 2.5 to 25 $\mu$m. (However, the absorption due to C—H radicals were excluded.)

Scratch Resistance Test

After the films were scratched with a piece of glass, they were observed through a microscope and no scratch were seen.

EXAMPLE 20

Figure 5:
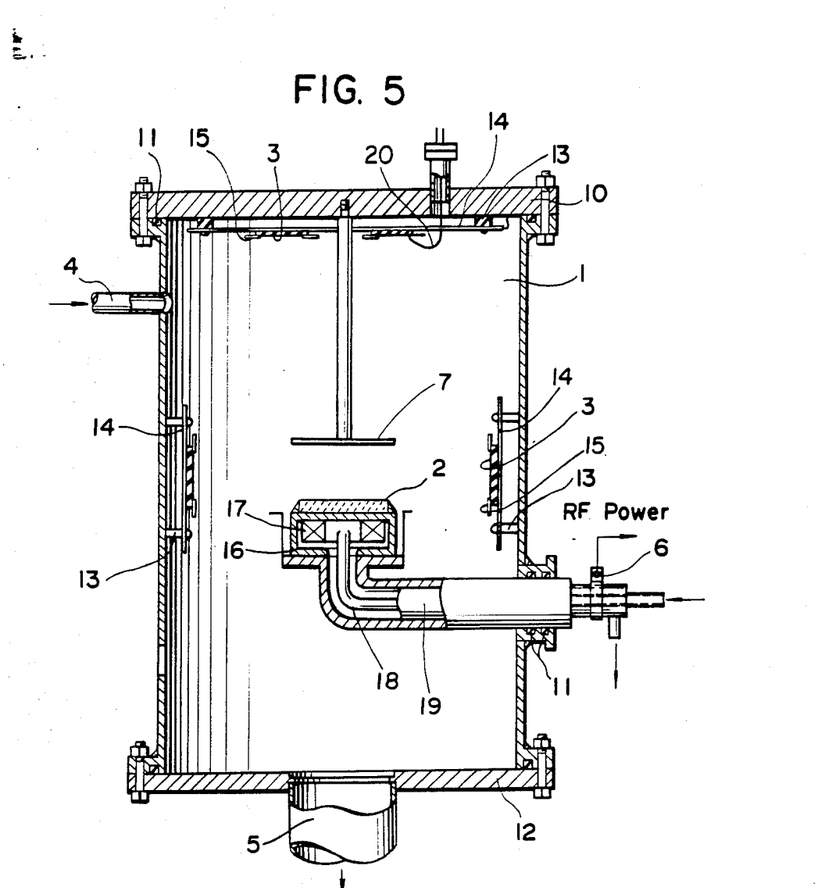
FIG. 5 is a sectional view showing in somewhat more detail a sputtering apparatus in accordance with the present invention.

The sputtering was defected by a sputtering apparatus of the type shown in FIG. 5. In the Figure, the same reference numerals as used in FIG. 1 represent the same or equivalent components.

A vacuum chamber 1 is composed of two covers and a cylinder provided three flanges which are sealed with O-rings. Numeral 10 designates a metal upper cover sealed with an O-ring. Numeral 12 designates a lower cover sealed by a sealing method which allows it to perform the same function as the upper cover 10 and it is constructed so that a hermetic sealing can be provided for it excluding its specially provided opening by means of welding or the like. Numeral 13 designates insulating terminals, or supports 14 electrically grounded receptors, 3 deposition substrates made of an consulating material or metal, and 15 substrate supporting members. It will be apparent that while, in this embodiment, the deposition substrates 3 are arranged in the position on the upper and side walls of the chamber which are external to the plasma generating section and the travel path of the plasma, they are not neccessarily limited to these positions since it is only necessary that they are located outside the plasma excited source which is indicated as the C region in FIG. 1. Numeral 2 designates a carbonaceous target, 16 an electrode box, 17 a magnetron, 18 a cooling water supplying metal pipe, and 19 a drain pipe. The end of the cooling water pipe 18 outside the vacuum chamber is sealed watertight by welding. Numeral 20 designates a thermocouple.

Numeral 7 designates a counter electrode for the target 2 and the target electrode 2 includes a connector which is provided outside the vacuum chamber 1 for connection with a high frequency power source. In addition, the matching box and the high frequency power source 6 shown in FIG. 1 are connected to the connector, although they are not shown.

Numeral 4 designates an atmosphere gas inlet pipe connected to the vacuum chamber 1 so as to introduce an atmosphere gas consisting of hydrogen or hydrogen and fluorine. An exhaust pipe 5 is arranged to reduce the internal pressure of the vacuum chamber 1 through a vacuum pump which is not shown. The following table shows the results of the sputtering condition effected for 2 hours by applying a high frequency power of 13.56 MHz and using high-purity hydrogen of 99.999 vol. % as the atmosphere gas in a sputtering apparatus employing the above-mentioned deposition substrate arrangement and a sputtering apparatus having the substrate arranged in the same counter electrode position as previously for purposes of comparison. In that case, the sputtering conditions were as follows.

| | | |
|---|---|---|
| i | Distance between target and counter electrode | 35 mm |
| ii | Hydrogen pressure | 26.7 Pa (0.2 Torr) |
| iii | Supply voltage | 2.3 kV |
| iv | Supply current | 0.55 A |
| v | Relative current density | 12.46 mA/cm$^2$ |
| vi | Deposition substrate temperature | 100° C. |

| | Film thickness ($\mu$m) | H/C ratio | Optical gap (eV) | Electric resistivity ($\Omega$ cm) | Spin density (1/cm$^3$) |
|---|---|---|---|---|---|
| Conventional position | 1.5 | 0.82 | 2.5 | $1 \times 10^9$ | $7 \times 10^{18}$ |
| Side wall | 3.0 | 0.75 | 2.9 | $2 \times 10^{12}$ | $5 \times 10^{17}$ |
| Upper wall | 2.0 | 0.88 | 3.0 | $5 \times 10^{12}$ | $3 \times 10^{17}$ |
| *Net inserted | 1.2 | 0.75 | 2.9 | $5 \times 10^{12}$ | $5 \times 10^{17}$ |

Figure 6:
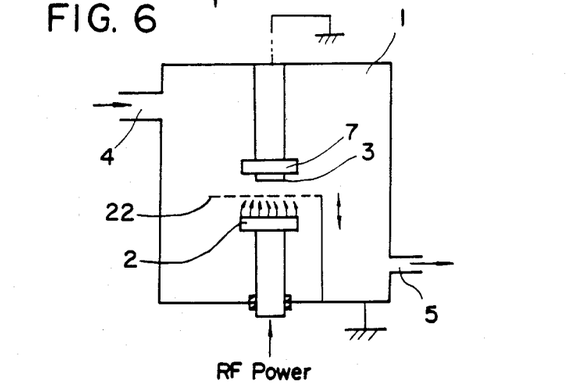
FIG. 6 is a schematic diagram useful for explaining an arrangement in which a grounded electrode is arranged between the electrodes in accordance with other embodiment of the present invention.

*In this case, as shown in FIG. 6, a mesh electrode 22 was arranged as a plasma adjusting electrode at a position apart from the target by 25 mm and the electrode 22 was grounded. Also, the sputtering was effected by selecting the target to counterelectrode distance 25 mm and the target to mesh distance 15 mm and the thickness of the resulting film was 25 $\mu$m. In this case, substantially the same results were obtained by using a fluorine gas as the atmosphere gas in place of the hydrogen gas or byusing a high-carbon material as the target material in place of the graphite. The resulting film was exposed to the irradiation of a white light and the resulting interference fringes were observed showing that there was seen no distortion of the interference fringes and the uniformly spaced fringes were observed.

It is to be noted that while the mesh electrode may literally be in the form of a mesh, it may also be a metal sheet formed with an innumerable number of pin holes so as to obtain the same effect as the mesh. Also, since the essential point is the adjustment of the amount of plasma, the invention is not limited to the method employing a grounded mesh and the same object can be accomplished by for example applying the potential supplied from a separate power supply to the plasma adjusting electrode.

Further, where such mesh is employed, the amount of plasma may be adjusted by for example sliding the mesh to change its position as shown by the arrows in FIG. 6.

EXAMPLE 21

Example 20 was repeated except that a fluorine gas or a mixed gas of hydrogen and fluorine was used in place of the hydrogen gas. As a result, the thermal resistance (the temperature at which the optical gap starts decreasing) was improved by the use of the mixed gas to 500° C. from 300° C. attained by the amorphous carbon film and also the use of carbon fluoride for the target improved the thermal resistance to 500° C.

What is claimed is:

1. An amorphous carbon coating film produced by sputtering a graphite target electrode in an atmosphere gas selected from the group consisting of hydrogen, fluorine and a mixture of hydrogen and fluorine having a pressure of 6.665 to 666.5 Pa (0.05 to 5.0 Torr) while maintaining a temperature of a deposition substrate between a room temperature and 100° C. and a relative current density which is a ratio of a plate current value to an area of target electrode for said graphite target electrode and an anode between 11.3 and 14.7 mA/cm$^2$ whereby the value of H/C or (H+F)/C in terms of an atomic ratio is made between 0.5 and 0.9.

2. A method of producing a coating film comprising the steps of: selecting a gas from the group consisting of hydrogen, fluorine and a mixture of hydrogen and fluorine and maintaining a pressure of said gas within a vacuum chamber between 6.665 and 666.5 Pa (0.05 and 5.0 Torr); and sputtering a graphite target electrode in said vacuum chamber while maintaining a temperature of a deposition substrate between a room temperature and 100° C. and a relative current density which is a ratio of a plate current value to an area of target electrode for said graphite target electrode and an anode between 11.3 and 14.7 mA/cm$^2$ thereby producing an amorphous carbon coating film in which the value of H/C or (H+F)/C in terms of an atomic ratio is between 0.5 and 0.9.

3. A method of producing a coating film according to claim 2, wherein said temperature of the deposition substrate maintaining step includes the step of providing said substrate in a position which is not exposed to a plasma.

4. A method of producing a coating film according to claim 3, wherein said substrate providing step is performed by arranging said substrate on a wall portion of the vacuum chamber.

5. A method of producing a coating film according to claim 2, wherein said sputtering target electrode step includes the step of doping said target with a semiconducting material.

6. A method of producing a coating film according to claim 5, wherein said target doping step includes the step of selecting said semiconducting material from boron or phosphorous.

7. A method of producing a coating film according to claim 2, wherein said gas selecting step further comprises the step of mixing said gas with a semiconducting gas.

8. A method of producing a coating film according to claim 7, wherein said semiconducting gas mixing step includes the step of selecting said semiconducting gas from the group consisting of nitrogen, a gas containing boron and a gas containing phosphorous.

9. In a sputtering apparatus having a vacuum container including an atmosphere gas inlet pipe, an exhaust pipe, at least one deposition substrate, a grounded electron drawing electrode and a graphite target electrode connected to a power source, said electrodes being positioned opposite to each other, and using a magnetic field to provide a directionality for a plasma, the improvement wherein said deposition substrate is arranged on an inner wall portion of said vacuum container in a region which is within said container but not directly exposed to said plasma.

10. In a sputtering apparatus having a vacuum container including an atmosphere gas inlet pipe, an exhaust pipe, at least one deposition substrate, a grounded electron drawing electrode and a carbonaceous target electrode connected to a power source, said electrodes being positioned opposite to each other, and using a magnetic field to provide a directionality for a plasma, the improvement wherein an electrode having an innumerable number of holes for adjusting the amount of said plasma is arranged between said electron drawing electrode and said carbonaceous target electrode.

11. An apparatus according to claim 10, wherein said plasma adjusting electrode is grounded.

12. An apparatus according to claim 10, wherein said plasma adjusting electrode is connected to another power source.

13. An apparatus according to claim 10, wherein said plasma adjusting electrode is a mesh electrode.

* * * * *